United States Patent [19]
Nakahata et al.

[11] Patent Number: 5,235,236
[45] Date of Patent: Aug. 10, 1993

[54] SURFACE ACOUSTIC WAVE DEVICE

[75] Inventors: Hideaki Nakahata; Shinichi Shikata; Akihiro Hachigo; Naoji Fujimori, all of Hyogo, Japan

[73] Assignee: Sumitomo Electric Industries, Ltd., Osaka, Japan

[21] Appl. No.: 937,983

[22] Filed: Aug. 28, 1992

[30] Foreign Application Priority Data

Sep. 26, 1991 [JP] Japan ................................. 3-248025

[51] Int. Cl.$^5$ .............................................. H01L 41/08
[52] U.S. Cl. ................................. 310/313 R; 310/313 A
[58] Field of Search ............... 310/313 R, 313 A, 363, 310/364; 333/151-155, 193-196

[56] References Cited

U.S. PATENT DOCUMENTS

| 4,518,944 | 5/1985 | Faris | 358/22 R |
| 4,952,832 | 8/1990 | Imai et al. | 310/313 A |
| 5,045,355 | 9/1991 | Spiro et al. | 427/249 |
| 5,152,930 | 10/1992 | Spiro et al. | 252/500 |
| 5,160,869 | 11/1992 | Nakahata et al. | 310/313 A |

FOREIGN PATENT DOCUMENTS

| 54-38874 | 11/1979 | Japan . |
| 64-62911 | 3/1989 | Japan . |
| 2299309 | 12/1990 | Japan . |

Primary Examiner—Mark O. Budd
Attorney, Agent, or Firm—W. G. Fasse

[57] ABSTRACT

Disclosed herein is a surface acoustic wave device whose characteristics can be stably maintained against temperature changes. The surface acoustic wave device has an insulating diamond layer (2), which is provided thereon with a part (3) defined by a pair of interdigital electrodes (7, 7') and a piezoelectric layer (8), and a thermistor (4) made of semi-conductive diamond. The thermistor (4) quickly detects the temperature of the device.

12 Claims, 7 Drawing Sheets

SURFACE ACOUSTIC WAVE DEVICE

BACKGROUND OF THE INVENTION

1. Field of the Invention

The present invention relates to a surface acoustic wave device which can be applied to a high frequency filter, for example, and more particularly, it relates to a surface acoustic wave device employing diamond layers.

2. Description of the Background Art

In a surface acoustic wave device, which can be miniaturized with a small number of elements, it is possible to input/output signals on a surface wave propagation path. Thus, the surface acoustic wave device is applied to a filter, a delay line, an oscillator, a resonator, a convolver, a correlator and the like. In particular, a surface acoustic wave filter has been practically applied to an intermediate frequency filter for a television for a long time, while the same is now being applied to filters for VTR and various communication devices.

A surface acoustic wave device, for example, has been generally manufactured by forming interdigital electrodes on a piezoelectric single-crystalline member of $LiNbO_3$ or $LiTaO_3$. Additionally, a piezoelectric thin film of ZnO or the like is recently formed on a substrate of glass or the like by a technique such as sputtering.

In relation to a surface acoustic wave filter, on the other hand, awaited is a device which can be employed at a higher frequency. In order to attain a higher center frequency in the frequency characteristics of a surface acoustic wave device, it is necessary to reduce electrode spacing of interdigital electrodes, or to increase the speed of surface waves. However, reduction in electrode spacing of the interdigital electrodes is restricted for limitation of the fine processing technology using lithography etc. To this end, there has been developed a surface acoustic wave device obtained by stacking a piezoelectric film on a material such as sapphire or diamond, for example, which propagates surface acoustic waves at a higher speed (refer to Japanese Patent Publication No. 54-38874 (1979) or 64-62911 (1989), for example).

In employment of such a surface acoustic wave device, characteristic changes of the device following temperature changes have recently come into question. Such temperature changes include that intrinsically caused by continuous application of an electric field to the surface acoustic wave device, and that extrinsically caused by an air temperature change and environmental variation. While these temperature changes cause characteristic changes such as changes of the center frequency, insertion loss, the frequency band being important for filter characteristics, and the like, the center frequency is extremely changed in particular. In a device, for example, which has a ZnO piezoelectric film formed on a diamond layer, the frequency is changed at a higher rate of 30 ppm/°C. Therefore, when the surface acoustic wave device is applied to a narrow-band intermediate frequency filter which is employed in general, for example, the center frequency is extremely varied to result in instability and impracticality.

SUMMARY OF THE INVENTION

An object of the present invention is to provide a surface acoustic wave device which is stable against temperature changes.

A surface acoustic wave device according to the present invention includes an insulating diamond layer, a semi-conductive diamond layer which is provided in contact with the insulating diamond layer for defining a thermistor part, a piezoelectric layer which is formed on the insulating diamond layer, and an electrode which is combined with the insulating diamond layer and the piezoelectric layer to define a surface acoustic wave element part.

In the surface acoustic wave device according to the present invention, the semi-conductive diamond layer is provided in contact with the insulating diamond layer, to define a thermistor part. The temperature of the surface acoustic wave element part is detected by the thermistor part, so that the temperature can be stabilized by feedback to a temperature stabilizer such as a heater.

The insulating diamond layer provided in the inventive surface acoustic wave device may be prepared from a diamond layer which is formed on a substrate, or a single-crystalline diamond substrate. The material for the substrate, which is provided thereon with the diamond layer, is not particularly restricted but may be prepared from an inorganic material such as Si, Mo, W, GaAs or $LiNbO_3$, for example.

The diamond layer formed on a substrate may be made of either single-crystalline or polycrystalline diamond. Alternatively, an amorphous diamond-type carbon film layer may be formed on a substrate.

A method of forming the diamond layer on a substrate is not particularly restricted, but a method such as CVD, microwave plasma CVD, plasma CVD, PVD or a thermal filament method can be employed, for example.

In order to grow diamond through vapor deposition by decomposing/exciting a raw material gas, employable is (1) a method of heating a thermoionic emission material to a temperature of at least 1500K for activating the raw material gas, (2) a method utilizing discharge by a direct current, a high frequency or a microwave electric field, (3) a method utilizing ion bombardment, (4) a method of applying light such as a laser beam, or (5) a method of burning the raw material gas.

According to the present invention, a compound containing carbon is generally employed as a raw material for forming diamond. This compound is preferably combined with hydrogen gas. Alternatively, the compound may be combined with another compound containing oxygen and/or an inert gas as needed. Examples of the compound containing carbon are paraffinic hydrocarbons such as methane, ethane, propane and butane, olefinic hydrocarbons such as ethylene, propylene and butylene, acetylenic hydrocarbons such as acetylene and allylene, diolefinic hydrocarbon such as butadiene, alicyclic hydrocarbons such as cyclopropane, cyclobutane, cyclopentane and cyclohexane, aromatic hydrocarbons such as cyclobutadiene, benzene, toluene, xylene and naphthalene, ketones such as acetone, diethylketone and benzophenone, alcohols such as methanol and ethanol, amines such as trimethylamine and triethylamine, carbonic acid gas, carbon monoxide and the like. One of these elements may be independently employed, or at least two such elements may be combined with each other. Alternatively, the compound containing carbon may be prepared from only carbon atoms of graphite, coal or coke. The compound containing oxygen is preferably prepared from oxygen, water, carbon monoxide, carbon dioxide or hydrogen peroxide, which is easy to obtain. The inert gas is preferably prepared from argon, helium, neon, krypton, xenon, radon or the like, for example.

The piezoelectric layer employed in the present invention can be prepared from a material which is mainly composed of one or more compounds selected from ZnO, A$\lambda$N, Pb(Zr,Ti)O$_3$, (Pb,La)(Zr,Ta)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe and CdS. While the piezoelectric layer may be either single-crystalline or polycrystalline, a single-crystalline material which causes smaller scattering or surface waves is more preferable in order to use the device in a higher frequency range. The piezoelectric layer of ZnO, A$\lambda$N and/or Pb(Zr,Ti)O$_3$ can be formed by CVD, sputtering or the like.

The semi-conductive diamond layer can be formed by introducing one or more elements selected from B, A$\lambda$, P, As, Sb, Si, Li, S, Se, C$\lambda$ and N into diamond as an impurity. The diamond layer can be doped with a proper amount of such an impurity, which is supplied in the form of a gas simultaneously with the raw material gas.

Alternatively, the diamond layer may be doped with such an impurity after formation, by a method such as ion implantation. Thus, it is also possible to form a semi-conductive diamond layer by ion-implanting an impurity into the insulating diamond layer which is provided according to the present invention.

According to the present invention, the electrode for defining the surface acoustic wave element part can be formed through etching, for example. As to the material, the electrode may be prepared from a metal having small resistivity such as Au, Ag or A$\lambda$ which can be deposited at a low temperature, or Ti, W or Mo having a high melting point, for example. Alternatively, two or more metals may be combined with each other, such that A$\lambda$ is formed on Ti. A$\lambda$ and Ta are preferable in consideration of easiness in formation of the electrode, while W and Mo are preferable in consideration of adhesion to the diamond layer.

According to the present invention, the electrode for defining the surface acoustic wave element part may be formed by the so-called interdigital electrode. This interdigital electrode can be prepared as follows: First, a metal film is formed and then a resist film is homogeneously applied onto the surface of the metal film. Then, a mask which is prepared by forming a interdigital electrode pattern on a transparent flat plate of glass or the like is placed on the resist film, and exposed by a mercury lamp or the like. Thereafter the resist film is developed to form a resist pattern, so that an interdigital electrode can be formed by etching. In the exposure step, an electron beam can be directly applied onto the resist film.

As to an etching method for forming the interdigital electrode, a metal having a low melting point such as A$\lambda$ may be etched by an alkaline solution such as a sodium hydroxide solution or an acid solution of nitric acid or the like by wet etching. Alternatively, a metal having a high melting point may be etched by a mixed solution of hydrofluoric acid and nitric acid. It is also possible to form the electrode by reactive ion etching through a gas such as BC$\lambda_3$.

According to the present invention, on the other hand, the electrode can be prepared from diamond having conductivity. Such diamond having conductivity can be formed by a method of vapor-growing diamond with supply of an impurity such as B, A$\lambda$, P or S, a method of doping insulating diamond with such an impurity by ion implantation, a method of applying an electron beam to insulating diamond for introducing a lattice defect, or a method of hydrogenating insulating diamond.

The position of the electrode which is formed in the present invention is not particularly restricted, but the electrode may be formed between the insulating diamond layer and the piezoelectric layer, or on the piezoelectric layer. Further, the electrode can be formed in combination with a short-circuit electrode.

In the surface acoustic wave device according to the present invention, the semi-conductive diamond layer is provided in contact with the insulating diamond layer, to define a thermistor part. Further, the surface acoustic wave element part is defined by the insulating diamond layer, the piezoelectric layer and the electrode. The thermistor part provided in the vicinity of the surface acoustic wave element part detects the temperature of the surface acoustic wave element part and feeds back the same to a temperature stabilizer, thereby stably maintaining the temperature of the surface acoustic wave element part.

In the surface acoustic wave device according to the present invention, both of the thermistor part and the surface acoustic wave element part are formed on the insulating diamond layer. Since diamond has the highest thermal conductivity among substances, it is possible to detect the temperature of the surface acoustic wave element part by the thermistor part, thereby attaining precise temperature control by high-speed response. Further, the inventive surface acoustic wave device can be miniaturized since the thermistor part and the surface acoustic wave element part are formed on the single insulating diamond layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
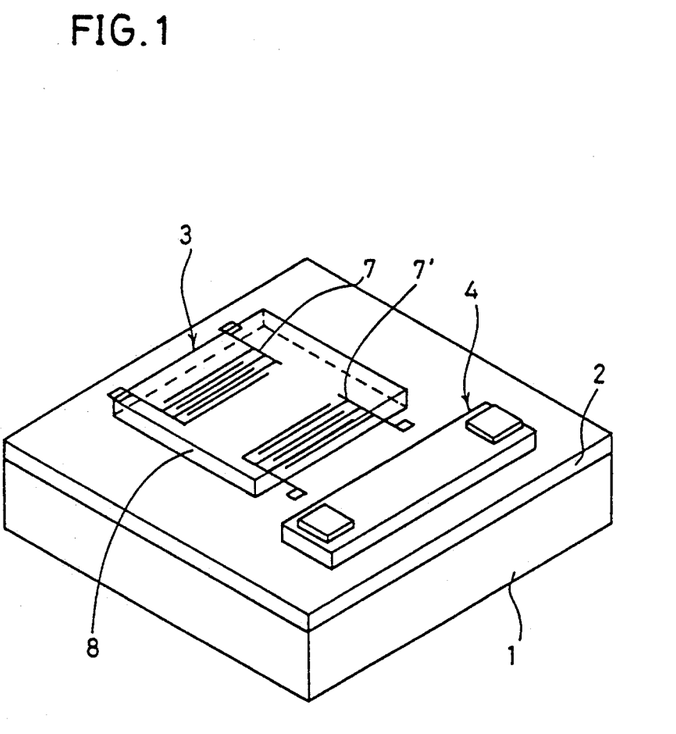
FIG. 1 is a perspective view showing a surface acoustic wave device according to a first embodiment of the present invention.

FIG. 1 is a perspective view showing a surface acoustic wave device according to a first embodiment of the present invention. Referring to FIG. 1, a diamond film 2 is formed on a substrate 1 of Si, for example, while a surface acoustic wave element part 3, which is defined by a pair of interdigital electrodes 7 and 7' and a ZnO film 8 serving as a dielectric member, and a thermistor part 4 are formed on the diamond film 2.

FIGS. 2A to 2G are sectional views showing steps of manufacturing the surface acoustic wave device shown in FIG. 1.

Figure 2A:
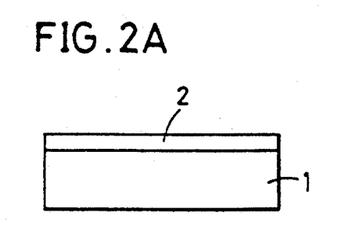
FIGS. 2A to 2G are sectional views typically showing steps of manufacturing the surface acoustic wave device according to the first embodiment.

Referring to FIG. 2A, a non-doped polycrystalline diamond film is grown on a substrate 1 by CVD to form an insulating diamond film 2, preferably in a thickness of about 5 to 30 $\mu$m. Then the surface of the as-formed insulating diamond film 2 is polished.

Figure 2B:
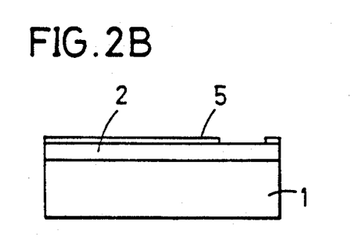

Referring to FIG. 2B, a Ti deposition film 5 is formed only on a prescribed portion of the insulating diamond film 2.

Figure 2C:
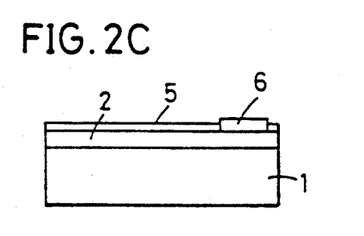

Referring to FIG. 2C, a diamond film doped with boron is selectively grown on another portion of the insulating diamond film 2 provided with no Ti deposition film 5, to form a semi-conductive diamond film 6.

Figure 2D:
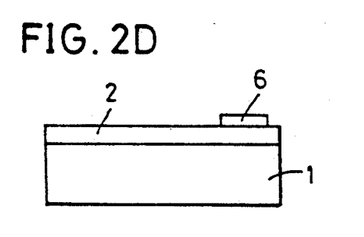

Referring to FIG. 2D, the Ti deposition film 5 is removed by hydrofluoric acid, to leave the semi-conductive diamond film 6.

Figure 2E:
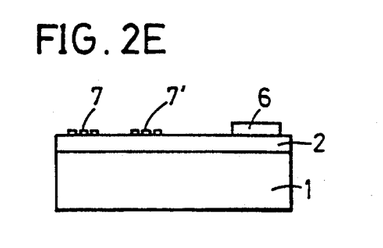

Referring to FIG. 2E, a pair of interdigital electrodes 7 and 7' are formed on the insulating diamond film 2 through the aforementioned lithography technique.

Figure 2F:
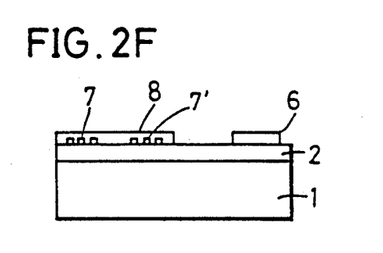

Referring to FIG. 2F, a ZnO film 8 is formed through CVD on the portion of the insulating diamond film 2 provided with the interdigital electrodes 7 and 7'.

Figure 2G:
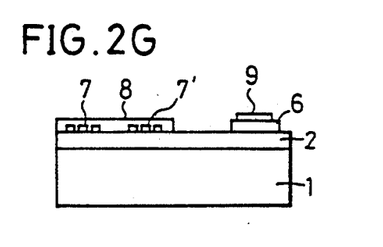

Referring to FIG. 2G, a thermistor electrode 9 is formed on each end of the semi-conductive diamond film 6 by sputtering or the like.

The surface acoustic wave device according to the first embodiment of the present invention can be formed in the aforementioned manner.

Figure 3:
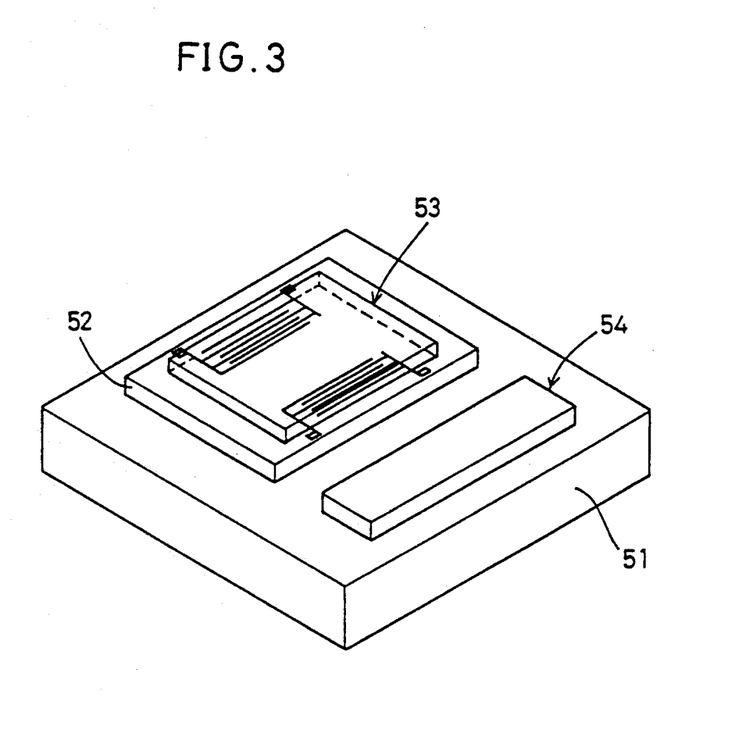
FIG. 3 is a perspective view showing a surface acoustic wave device according to comparative example.

On the other hand, FIG. 3 shows a surface acoustic wave device according to comparative example for the present invention. Referring to FIG. 3, a diamond film 52 is formed only on a specific portion of a substrate 51, while interdigital electrodes and a ZnO film are formed on this diamond film 52, to define a surface acoustic wave element part 53. Further, a semi-conductive diamond film is formed on another portion of the substrate 51, to define a thermistor part 54.

Temperatures of the inventive and comparative surface acoustic wave devices shown in FIGS. 1 and 3 were changed from 10° C. to 40° C. in practice, whereby the inventive surface acoustic wave device shown in FIG. 1 exhibited double response as compared with that shown in FIG. 3 in relation to temperature detection of the thermistor parts.

As understood from the above description, the surface acoustic wave device according to the present invention can detect the temperature in the thermistor part at a high speed, whereby it is possible to more correctly control the temperature of the surface acoustic wave element part. In the inventive device, therefore, it is possible to more stably maintain the performance, particularly the frequency characteristics, against temperature changes.

FIGS. 4A to 4E and 4F are sectional views and a plan view showing steps of manufacturing a surface acoustic wave device according to a second embodiment of the present invention.

Figure 4A:
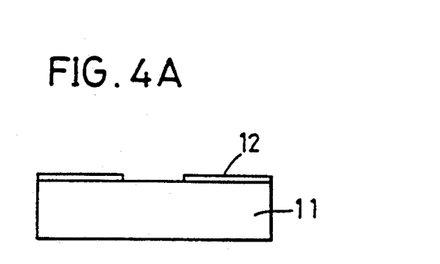
FIGS. 4A to 4E and 4F are sectional views and a plan view typically showing steps of manufacturing a surface acoustic wave device according to a second embodiment of the present invention.

Referring to FIG. 4A, a Ti deposition film 12 is formed only on a prescribed portion of a substrate 11.

Figure 4B:
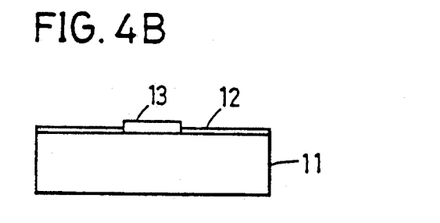

Referring to FIG. 4B, a diamond film doped with boron is then formed by CVD only on another portion of the substrate 11 provided with no Ti deposition film 12, to define a semi-conductive diamond film 13.

Figure 4C:
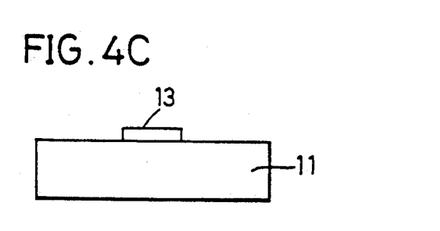

Referring to FIG. 4C, the Ti deposition film 12 is removed.

Figure 4D:
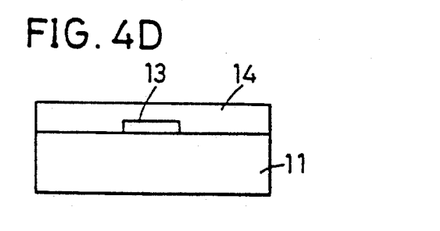
Figure 5:
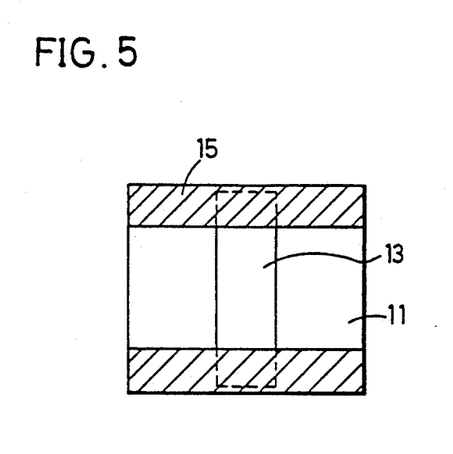
FIG. 5 is a plan view showing masks employed for forming a diamond thin film in the surface acoustic wave device according to the second embodiment.

FIG. 5 is a plan view showing masks for forming a diamond thin film in a step shown in FIG. 4D. Referring to FIG. 5, Ti is deposited to cover both end portions of the semi-conductive diamond film 13 while exposing only its central portion, thereby forming masks 15.

Referring to FIG. 4D, a non-doped diamond film is grown by CVD on the semi-conductive diamond film 13, both ends of which are covered with the masks 15, to form an insulating diamond film 14. Thereafter the surface of the insulating diamond film 14 is polished, and the masks 15 are removed.

Figure 4E:
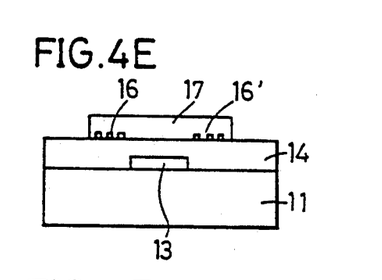

Referring to FIG. 4E, interdigital electrodes 16 and 16' are formed on the insulating diamond film 14, and a ZnO film 17 is formed thereon to serve as a piezoelectric layer.

Figure 4F:
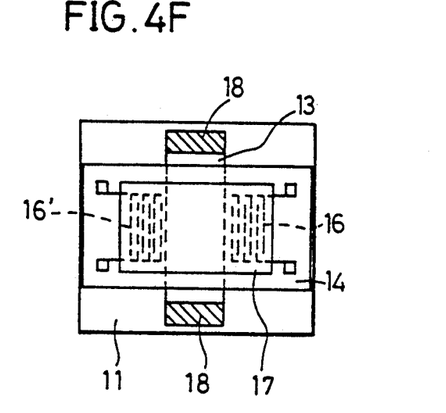

Referring to FIG. 4F, thermistor electrodes 18 are finally formed on both end portions of the semi-conductive diamond film 13.

Thus, the semi-conductive diamond film for serving as a thermistor part may be formed in contact with a surface which is opposite to that provided with the surface acoustic wave element part.

FIGS. 6A to 6D are sectional views showing steps of manufacturing a surface acoustic wave device according to a third embodiment of the present invention.

Figure 6A:
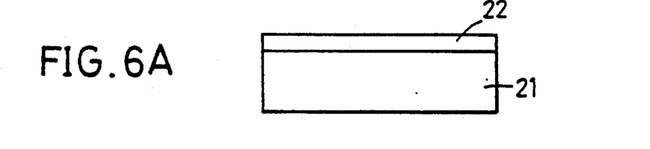
FIGS. 6A to 6D are sectional views typically showing steps of manufacturing a surface acoustic wave device according to a third embodiment of the present invention.

Referring to FIG. 6A, a non-doped diamond film is grown on a substrate 21 by CVD, to form an insulating diamond film 22. Thereafter the surface of the insulating diamond film 22 is polished.

Figure 6B:
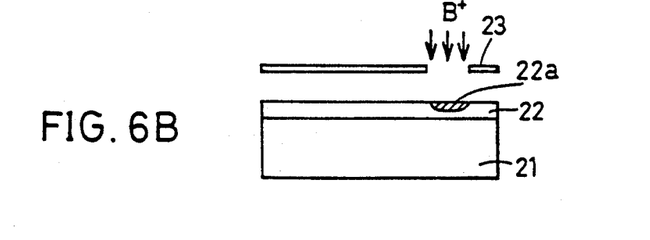

Referring to FIG. 6B, a mask 23 is employed to ion-implant boron into only a prescribed portion of the insulating diamond film 22, to form an ion-implanted part 22a. Thereafter the substance is annealed in a vacuum. This ion-implanted part 22b forms a semi-conductive diamond layer, which defines a thermistor part in this embodiment.

Figure 6C:
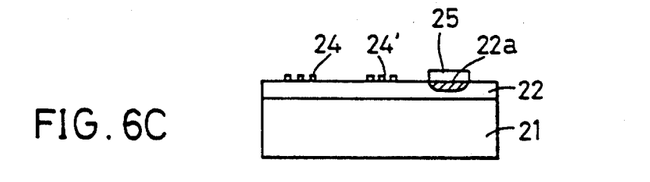

Referring to FIG. 6C, thermistor electrodes 25 are formed on the ion-implanted part 22a. Further, interdigital electrodes 24 and 24' are formed on a portion of the insulating diamond film 22 which is separated from the ion-implanted part 22a by a prescribed distance.

Figure 6D:
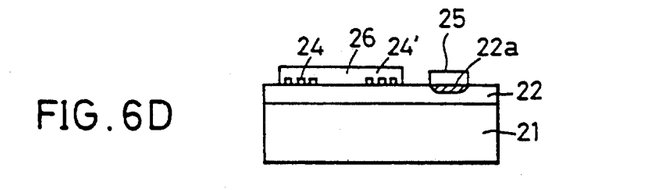

Referring to FIG. 6D, a ZnO film 26 is formed on the portion of the insulating diamond film 22 which is provided with the interdigital electrodes 24 and 24', to serve as a piezoelectric layer.

Thus, the semi-conductive diamond layer defining a thermistor part may be formed by ion-implanting an impurity into the insulating diamond layer.

While the semi-conductive diamond film is selectively grown through a Ti deposition film or the like in each of the aforementioned embodiments, the film may alternatively be formed by another method. For example, a patterned diamond film may be formed by growing a diamond thin film entirely over the surface of a substrate and partially removing the same by plasma etching with $CF_4$, $O_2$ or Ar for leaving only a prescribed portion.

Figure 7:
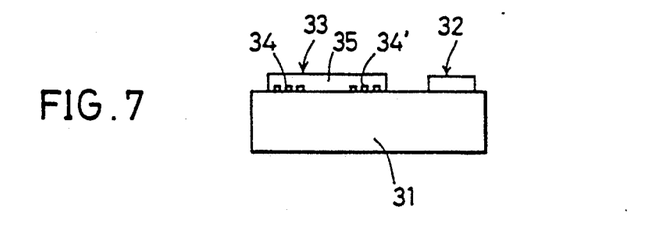
FIG. 7 is a sectional view showing a surface acoustic wave device according to a fourth embodiment of the present invention.
Figure 8:
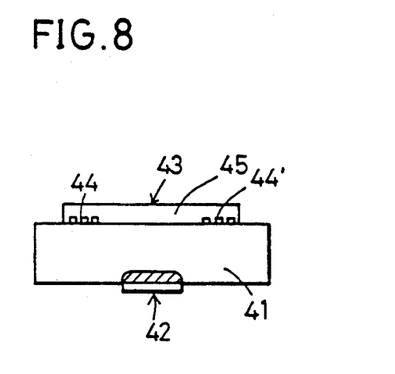
FIG. 8 is a sectional view showing a surface acoustic wave device according to a fifth embodiment of the present invention.

According to the present invention, the insulating diamond layer may be formed by a single-crystalline diamond substrate. FIGS. 7 and 8 show embodiments employing single-crystalline diamond substrates.

Referring to FIG. 7, a thermistor part 32 and a surface acoustic wave element part 33, which is defined by a pair of interdigital electrodes 34 and 34' and a piezoelectric member 35, are formed on the same surface of a single-crystalline diamond substrate 31.

Referring to FIG. 8, a surface acoustic wave element part 43, which is defined by a pair of interdigital electrodes 44 and 44' and a piezoelectric member 45, is formed on one surface of a single-crystalline diamond substrate 41, while a thermistor part 42 is formed on the other surface thereof by ion implantation.

As understood from the aforementioned embodiments, the thermistor part and the surface acoustic wave element part are provided on the insulating diamond layer in the inventive surface acoustic wave device, whereby it is possible to detect the temperature of the surface acoustic wave element part at a high speed to stably maintain the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device comprising:
   an insulating diamond layer;
   a semi-conductive diamond layer being provided in contact with said insulating diamond layer for defining a thermistor part;
   a piezoelectric layer being formed on said insulating diamond layer; and
   an electrode being combined with said insulating diamond layer and said piezoelectric layer for defining a surface acoustic wave element part.

2. A surface acoustic wave device in accordance with claim 1, wherein said semi-conductive diamond layer is essentially made of diamond containing an impurity being added thereto.

3. A surface acoustic wave device in accordance with claim 2, wherein said impurity contained in said diamond is selected from a group of B, Aλ, P, As, Sb, Si, Li, S, Se, Cλ and N.

4. A surface acoustic wave device in accordance with claim 1, wherein said thermistor part is formed by a portion of said insulating diamond layer containing an impurity being added thereto.

5. A surface acoustic wave device in accordance with claim 1, wherein said piezoelectric layer is essentially made of one or more materials selected from a group of ZnO, AλN, $Pb(Zr,Ti)O_3$, $(Pb,La)(Zr,Ti)O_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe and CdS.

6. A surface acoustic wave device in accordance with claim 1, wherein said electrode is essentially made of diamond containing an impurity being added thereto or diamond containing a lattice defect being introduced thereinto.

7. A surface acoustic wave device comprising:
   a substrate;
   an insulating diamond layer being formed on said substrate;
   a semi-conductive diamond layer being in contact with said insulating diamond layer for defining a thermistor part;
   a piezoelectric layer being formed on said insulating diamond layer; and
   a pair of interdigital electrodes being in contact with said piezoelectric layer.

8. A surface acoustic wave device in accordance with claim 7, wherein said semi-conductive diamond layer is essentially made of diamond containing an impurity being added thereto.

9. A surface acoustic wave device in accordance with claim 7, wherein said thermistor part is defined by a portion of said insulating diamond layer containing an impurity being added thereto.

10. A surface acoustic wave device comprising:
    a substrate being essentially made of diamond;
    a semi-conductive diamond layer being formed on said substrate to define a thermistor part;
    a piezoelectric layer being formed on said substrate; and
    a pair of interdigital electrodes being in contact with said piezoelectric layer.

11. A surface acoustic wave device in accordance with claim 10, wherein said semi-conductive diamond layer is essentially made of diamond containing an impurity being added thereto.

12. A surface acoustic wave device in accordance with claim 10, wherein said thermistor part is defined by a portion of said substrate containing an impurity being added thereto.

* * * * *

UNITED STATES PATENT AND TRADEMARK OFFICE
CERTIFICATE OF CORRECTION

PATENT NO. : 5,235,236
DATED : August 10, 1993
INVENTOR(S) : Hideaki Nakahata et al.

It is certified that error appears in the above-indentified patent and that said Letters Patent is hereby corrected as shown below:

```
Column 3, line  7, replace "AλN" by --AℓN--;
          line 14, replace "AλN" by --AℓN--;
          line 18, replace "Aλ" by --Aℓ--, replace "Cλ"
                   by --Cℓ--;
          line 33, replace "Aλ" by --Aℓ--;
          line 37, replace "Aλ" by --Aℓ-- (both instances);
          line 63, replace "BCλ₃" by --BCℓ₃--
          line 68, replace "Aλ" by --Aℓ--;
Column 7, line 46, replace "Aλ" by --Aℓ--;
          line 47, replace "Cλ" by --Cℓ--;
Column 8, line  6, replace "AλN" by --AℓN--.
```

Signed and Sealed this

Eighth Day of March, 1994

Attest:

BRUCE LEHMAN

*Attesting Officer*  *Commissioner of Patents and Trademarks*